US009559166B2

(12) United States Patent
Ray et al.

(10) Patent No.: US 9,559,166 B2
(45) Date of Patent: Jan. 31, 2017

(54) FABRICATING TRANSISTORS HAVING RESURFACED SOURCE/DRAIN REGIONS WITH STRESSED PORTIONS

(71) Applicant: GLOBALFOUNDRIES Inc., Grand Cayman (KY)

(72) Inventors: Shishir Ray, Clifton Park, NY (US); Bharat Krishnan, Mechanicville, NY (US); Min-hwa Chi, Malta, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 56 days.

(21) Appl. No.: 14/609,504

(22) Filed: Jan. 30, 2015

(65) Prior Publication Data
US 2016/0225852 A1 Aug. 4, 2016

(51) Int. Cl.
H01L 29/08 (2006.01)
H01L 29/66 (2006.01)
H01L 29/78 (2006.01)
H01L 21/324 (2006.01)
H01L 29/04 (2006.01)
H01L 21/268 (2006.01)

(52) U.S. Cl.
CPC ......... *H01L 29/0847* (2013.01); *H01L 21/268* (2013.01); *H01L 21/3247* (2013.01); *H01L 29/045* (2013.01); *H01L 29/66568* (2013.01); *H01L 29/7847* (2013.01)

(58) Field of Classification Search
CPC .............. H01L 29/0847; H01L 21/268; H01L 21/3247; H01L 29/045; H01L 29/66568

USPC ..................... 257/77, 401; 438/299, 301, 535
See application file for complete search history.

(56) References Cited

U.S. PATENT DOCUMENTS

| | | | |
|---|---|---|---|
| 6,844,250 B1 * | 1/2005 | Wang | H01L 21/26506 257/E21.335 |
| 8,609,510 B1 | 12/2013 | Banna et al. | |
| 2007/0032026 A1 * | 2/2007 | Ong | H01L 21/02532 438/301 |
| 2008/0163813 A1 * | 7/2008 | Zollner | H01L 29/1054 117/2 |
| 2013/0087832 A1 | 4/2013 | Yu et al. | |
| 2015/0097197 A1 * | 4/2015 | Ganz | H01L 29/785 257/77 |
| 2015/0295085 A1 * | 10/2015 | Yu | H01L 29/7847 257/401 |

* cited by examiner

*Primary Examiner* — Errol Fernandes
(74) *Attorney, Agent, or Firm* — Heslin Rothenberg Farley & Mesiti PC; Nicholas Mesiti

(57) ABSTRACT

Methods are providing for fabricating transistors having at least one source region or drain region with a stressed portion. The methods include: forming, within a cavity of a substrate structure, the at least one source region or drain region with the internal stress; and resurfacing the at least one source region or drain region to reduce surface defects of the at least one source region or drain region without relaxing the stressed portion thereof. For instance, the resurfacing can include melting an upper portion of the at least one source region or drain region. In addition, the resurfacing can include re-crystallizing an upper portion of the at least one source region or drain region, and/or providing the at least one source region or drain region with at least one {111} surface.

19 Claims, 8 Drawing Sheets

FABRICATING TRANSISTORS HAVING RESURFACED SOURCE/DRAIN REGIONS WITH STRESSED PORTIONS

FIELD OF THE INVENTION

The present invention relates to methods of fabricating semiconductor structures and more particularly to fabricating transistors having resurfaced source regions or drain regions with stressed portions.

BACKGROUND OF THE INVENTION

Consumer demand for electronic devices with increased functionality continues to drive the semiconductor industry to pursue enhanced performance of integrated circuits. Therefore, various methods to increase the speed of semiconductor devices, such as transistors, have been proposed. For instance, increasing mobility of charge carriers in the transistor can lead to enhanced performance.

However, some techniques for enhancing semiconductor device performance can require complex additional fabrication processing steps, leading to potential defects, decreased yield, and increased costs. For example, one technique for enhancing performance of a transistor includes providing stress to a channel region thereof, leading to enhanced charge carrier mobility and faster performance. Disadvantageously, stressed channel regions can increase fabrication complexity, leading to increased costs and reduced yields.

BRIEF SUMMARY

The shortcomings of the prior art are overcome, and additional advantages are provided, through the provision, in one aspect, of a method. The method includes fabricating a transistor over a substrate structure, the transistor including at least one of a source region or a drain region, where the at least one source region or drain region includes a stressed portion, and the fabricating includes: forming, within a cavity of the substrate structure, the at least one source region or drain region including the stressed portion thereof; and resurfacing the at least one source region or drain region to reduce surface defects of the at least one source region or drain region without relaxing the stressed portion thereof.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
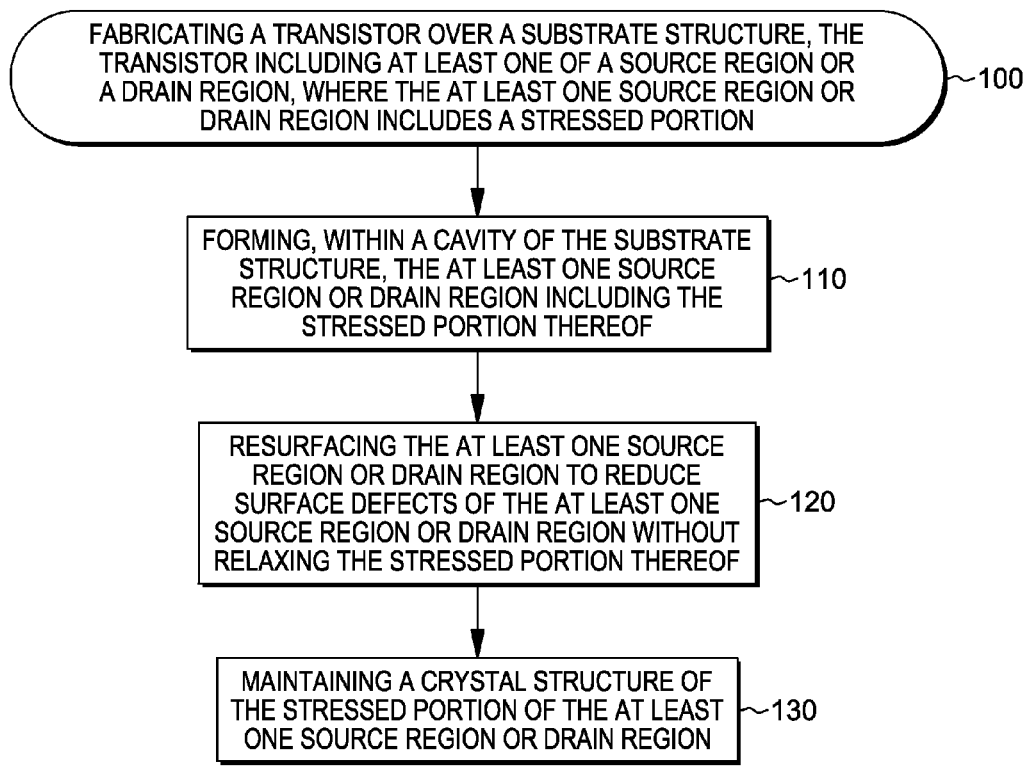
FIGS. 1A-1D depict embodiments of processes for fabricating a transistor, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, methods for fabricating transistors having resurfaced source regions or drain regions with stressed portions. As the semiconductor industry continues to strive to produce semiconductor devices, such as transistors, with enhanced performance, additional process steps can lead to defects and reduce fabrication yield. For example, stress engineering techniques may be used to introduce stresses and strains into transistor channel regions to increase the mobility of charge carriers therein. Such techniques can include silicon epitaxial growth (e.g., with germanium or carbon doping) and/or stress memorization techniques (SMT) by the deliberate formation of crystal defects (e.g., as an indication of the existence of strain) in a semiconductor structure, such as the formation of stacking faults or dislocations within a source or drain junction.

However, such techniques can also lead to semiconductor regions, such as semiconductor surfaces, with imperfections or defects. During subsequent semiconductor device fabrication processing, the imperfections or defects near surfaces can cause problems, leading to device failure and yield loss, driving up overall fabrication costs. For example, epitaxially grown structures and/or regions with induced memorized stresses can have surface defects, such as dislocations or cracks. During a material deposition process, materials can diffuse into such structures through the surface defects, and create short circuits or voids, thus leading to circuit failure. Also, after formation of stressed portions with epitaxial growth or memorized stresses, subsequent processing steps must be careful to avoid disturbing the stressed regions and accidentally relaxing the stress therein, negating the desired performance improvements.

For instance, during a self-aligned silicide process, a metal, such as nickel, cobalt, or titanium, typically used in complementary metal oxide semiconductor (CMOS) technology, can be deposited over a source region or a drain region of a transistor and annealed, in order to form a metal-silicide material in contacts. However, these metal atoms can diffuse faster and deeper through any defects or imperfections on surfaces and/or below surfaces (e.g., sub-surface defects) and diffuse into, for example, the transistor junction. In addition, during a chemical process, such as wet etching or chemical mechanical polishing (CMP) process, chemicals, can etch faster into junction through surface defects or imperfections, and undesirably etch away portions of the transistor or form voids in devices that can adversely impact performance or increase meant time to failure.

Advantageously, the present disclosure provides techniques for resurfacing semiconductor regions, such as source regions or drain regions of field-effect transistors. For instance, resurfaced source regions or drain regions can prevent damage during subsequent processing steps such as silicide formation or chemical processing, without adversely impacting or relaxing previously stressed portions. In addition, resurfaced source regions or drain region can reduce capacitance, such as stray capacitance between a source region or drain region contact and a gate contact structure, if the resurfaced source regions or drain regions include facets that slope away from the gate structures. Further, resurfaced source regions or drain regions can facilitate formation of source or drain contacts, e.g. when source regions or drain regions are formed adjacent to isolation structures, because prior to resurfacing, epitaxially grown source regions or drain regions can be asymmetric.

Reference is made below to the drawings, which are not drawn to scale for ease of understanding, where the same reference numbers used throughout different figures designate the same or similar components.

FIGS. 1A-1D depict embodiments of processes for fabricating a transistor, in accordance with one or more aspects of the present invention.

With regard to FIG. 1A, in one embodiment, a method includes: fabricating a transistor over a substrate structure, the transistor including at least one of a source region or a drain region, where the at least one source region or drain region includes a stressed portion 100. In such a case, fabricating 100 can include: forming, within a cavity of the substrate structure, the at least one source region or drain region including the stressed portion thereof 110; and resurfacing the at least one source region or drain region to reduce surface defects of the at least one source region or drain region without relaxing the stressed portion thereof 120. In such a case, for example, the resurfacing can also reduce sub-surface defects located just below the surface.

In another embodiment, the method further includes: maintaining, during the resurfacing, a crystal structure of the stressed portion of the at least one source region or drain region 130. In a further embodiment, the method further includes providing a metallic material over the at least one source region or drain region, where resurfacing the at least one source region or drain region inhibits diffusion of the metallic material into the at least one source region or drain region.

Figure 1B:
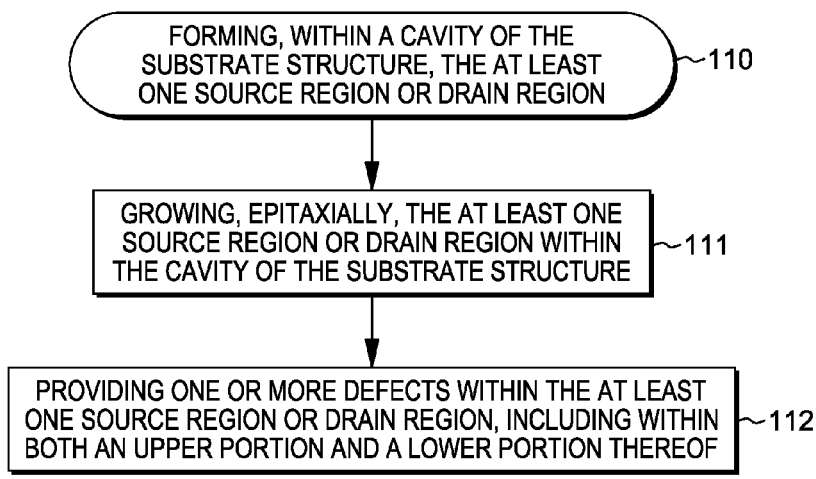

With regard to FIG. 1B, in one embodiment, the forming 110 includes: growing, epitaxially, the at least one source region or drain region within the cavity of the substrate structure 111. In another embodiment, the forming 110 includes providing one or more defects within the at least one source region or drain region, including within both an upper portion and a lower portion thereof 112.

In a further embodiment, the forming 110 includes maintaining the one or more defects of a lower portion of the at least one source region or drain region, where the one or more defects of the lower portion include the stressed portion of the at least one source region or drain region.

Figure 1C:
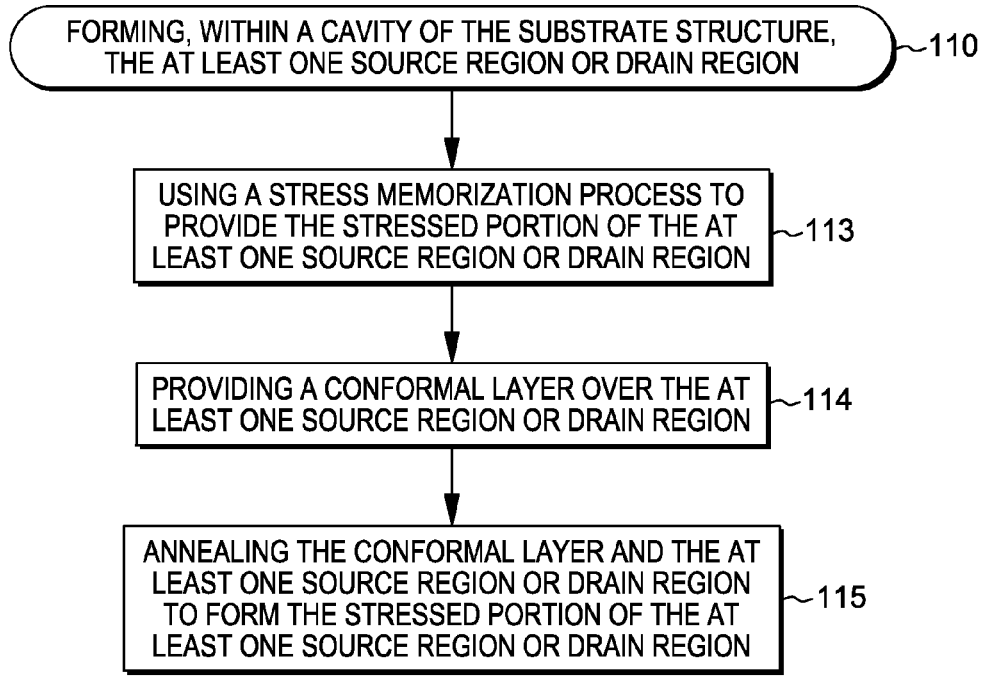

With regard to FIG. 1C, in one embodiment, the forming 110 includes using a stress memorization process to provide the stressed portion of the at least one source region or drain region 113. In another embodiment, the forming 110 includes providing a conformal stress layer over the at least one source region or drain region 114.

In a further example, the forming 110 includes annealing a conformal stress layer and the at least one source region or drain region to memorize the stress (from the conformal layer) and form the stressed portion of the at least one source region or drain region 115.

Figure 1D:
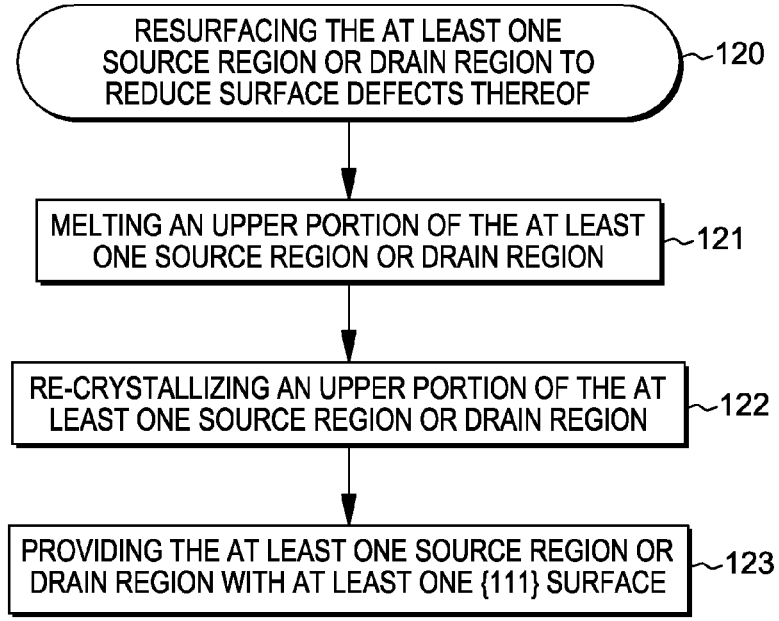

With regard to FIG. 1D, in one embodiment, the resurfacing 120 includes melting an upper portion of the at least one source region or drain region without melting the stressed portion thereof 121. In another embodiment, the resurfacing 120 includes re-crystallizing an upper portion of the at least one source region or drain region 122. In a further embodiment, the resurfacing 120 includes providing the at least one source region or drain region with at least one {111} surface 123.

In one example, the resurfacing 121 includes laser annealing the upper portion of the at least one source region or drain region to reduce the surface defects thereof. In another example, the resurfacing 120 includes reducing the one or more defects of the upper portion of the at least one source region or drain region. In a further example, where the transistor includes a channel region of the substrate structure adjacent to the at least one source region or drain region and a gate structure disposed above the channel region, the resurfacing can include decreasing a capacitance between the at least one source region or drain region and the gate structure of the transistor.

In one implementation, where the transistor includes a channel region of the substrate structure adjacent to the at least one source region or drain region, the resurfacing 120 can include shifting the upper portion of the at least one source region or drain region away from the channel region of the transistor to facilitate forming a conductive contact on the at least one source region or drain region. In another implementation, the resurfacing 120 inhibits diffusion into the at least one source region or drain region. In a further implementation, the resurfacing 120 includes reducing an electrical resistance of the at least one source region or drain region.

Figure 2A:
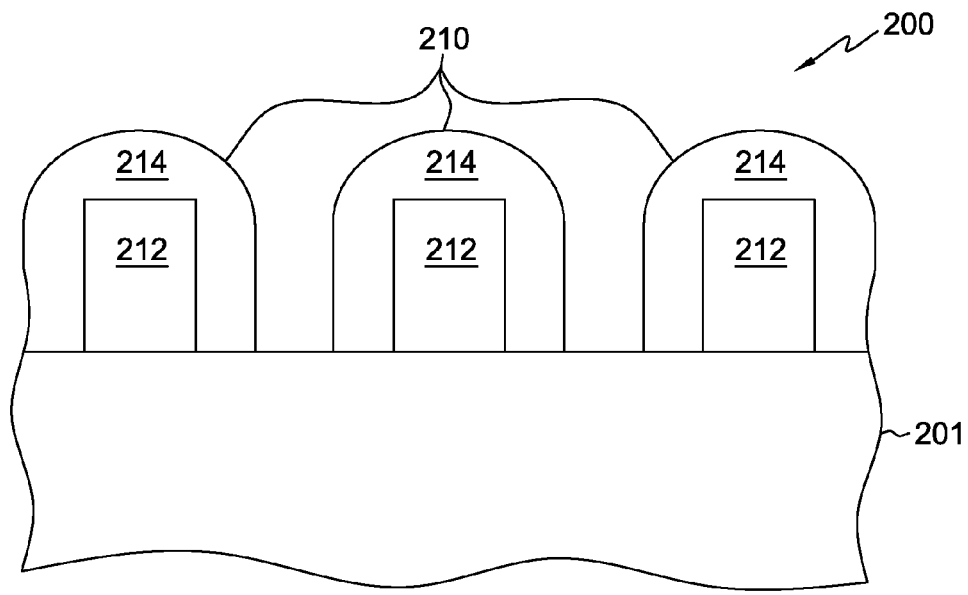
FIG. 2A is a cross-sectional elevational view of a structure found in transistor fabrication, in accordance with one or more aspects of the present invention.

FIG. 2A is a cross-sectional elevational view of a structure 200 found in integrated circuit fabrication, in accordance with one or more aspects of the present invention.

By way of explanation, structure 200 can include an entire wafer used in the fabrication of integrated circuits which can include thousands, millions, billions, or more semiconductor devices, such as transistors. Subsequent to fabrication processing, structure 200 can be diced into individual dies or integrated circuits (i.e., chips), and packaged for use in electronic devices. The techniques described herein can be applied across an entire wafer or portion thereof.

In the embodiment of FIG. 2A, a gate structure 210 is disposed above a substrate structure 201. Gate structure 210 can include a gate 212 and spacer 214. In one example, gate structure 210 is a final gate structure, and gate 212 is, for example, a metal gate. In another example, gate structure 210 is formed by a replacement gate process, and gate 212 is a sacrificial (or dummy) gate, which is designed to be removed and replaced later with a final gate. In such an example, after removal of gate 212 and a top portion of spacer 214, a replacement gate can be formed within side portions of spacer 214. In another example, a gate dielectric layer (not shown for simplicity) can be included between gate 212 and substrate 201 (e.g., in a gate-first metal gate process). In a further example, a gate dielectric layer, such as silicon oxide or hafnium oxide, can be provided between a final gate and substrate 201 in a subsequent processing step (e.g., in a replacement gate process).

Structure 200 includes a substrate structure 201, which can be a semiconductor wafer. In one embodiment, substrate structure 201 can be a bulk semiconductor material such as a bulk silicon wafer. In another embodiment, substrate structure 201 can include silicon (Si), single crystal Si, polycrystalline Si, amorphous Si, Si-on-nothing (SON), Si-on-insulator (SOI), or Si-on-replacement insulator (SRI). In a further embodiment, substrate 205 can be n-type or p-type doped. In one particular example, substrate 205 can have a thickness of approximately 600-900 micrometers. In another example, substrate structure 201 can include a plurality of three dimensional fin shaped structures upon which three dimensional semiconductor devices such as transistors can be formed.

Gate structures 210, including gate 212 and spacers 214, can be formed using any suitable deposition process, such as atomic layer deposition (ALD), chemical vapor deposition (CVD), or physical vapor deposition (PVD), and/or through a photolithographic process. Gate 212 can include any conductive material, such as a metal, including aluminum, cobalt, titanium, tungsten, polycrystalline silicon, or any combination thereof. Spacers 214 can include, for example, a nitride, such as silicon nitride.

Figure 2B:
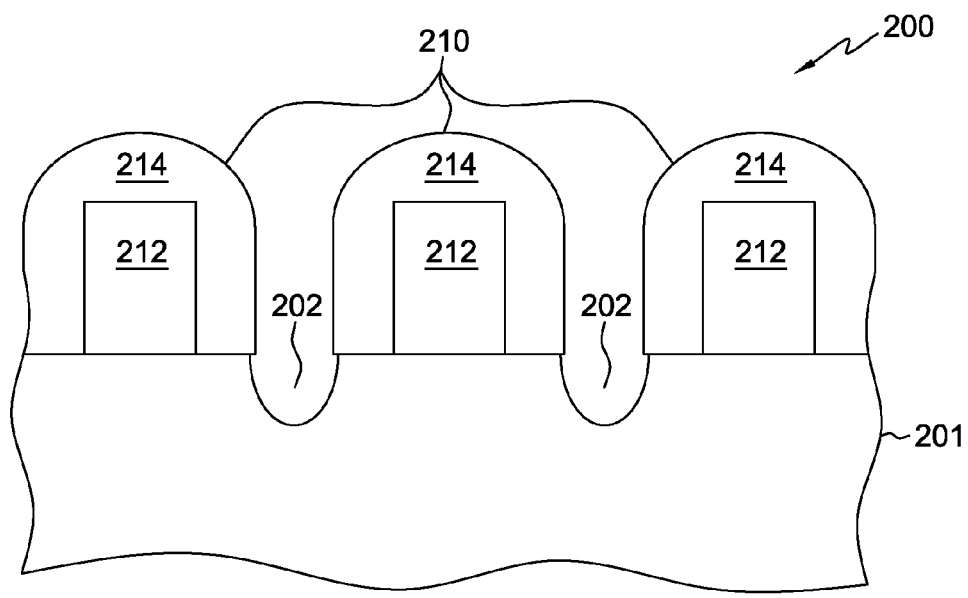
FIG. 2B depicts the structure of FIG. 2A after providing a cavity of a substrate structure thereof, in accordance with one or more aspects of the present invention.

FIG. 2B depicts structure 200 after providing a cavity 202 within substrate structure 201, in accordance with one or more aspects of the present invention. In the embodiment of FIG. 2B, cavity 202 is U-shaped, and can be formed by etching substrate 201 using an etching process that selectively etches the material of substrate 201 without etching material of gate structure 210. As illustrated, cavity 202 is self aligned between gate structures 210 allowing for formation of source regions or drain regions within cavities 202. Advantageously, cavity 202 is therefore aligned adjacent to a channel region of substrate 201 which is located below gate structure 210. The width of spacers 214 can be adjusted to tune spacing between cavities 202 and gates 212.

In one embodiment, isotropic etching may be performed by, for example, dry etching such as reactive ion etching (RIE) or plasma etching, using gases highly reactive to the material of active layer 106, such as tetrafluoromethane ($CF_4$), sulfur hexafluoride ($SF_6$), boron chloride, ($BCl_3$), or nitrogentrifluoride ($NF_3$) with process parameters tuned to yield isotropic etching of substrate 201. As known, RIE, which uses a reactive plasma material, has features of both chemical etching and physical etching, and therefore process parameters may be tuned to achieve either isotropic RIE. For example, the plasma could be created at a very low, or without any, wafer chuck bias power, such that the incident species have reduced directionality, leading to isotropic etching. In an isotropic etching process, material is removed in substantially the same amount in all directions, leading to curved cavity shapes, such ball-shaped cavities.

In another embodiment, anisotropic etching, such as U-shaped etching, may be performed by, for example, dry etching such as reactive ion etching (RIE), or plasma etching, using tetrafluoromethane ($CF_4$), sulfur hexafluoride ($SF_6$), or boron chloride ($BCl_2$), with process parameters tuned to yield anisotropic etching of substrate 201. In anisotropic etching, etching can be confined to a particular direction, such as downward into substrate structure 201.

In a further embodiment, anisotropic wet etching using, for example, potassium hydroxide (KOH) or tetra-methylammonium hydroxide (TMAH) could be used to form cavities 202 with sigma shape. Sigma shaped cavities are named for the resemblance between the Greek-letter $\Sigma$ (sigma) and the profile of its angular planes $\{111\}$ which is in the slowest etching than other surfaces $\{110\}$ or $\{100\}$ by KOH or TMAH. After performing anisotropic etching, another step, or series of steps, of etching, including isotropic and anisotropic etching steps, including for example wet etching using TMAH, may be performed to further shape or clean cavities 202, depending upon the application. For example, p-type transistors and n-type transistors can be fabricated so that they have different shaped cavities in different regions of structure 200.

In addition, depending on the desired final shape of cavities 202, one or more steps of etching can be used, for example isotropic etching followed by anisotropic etching, or anisotropic etching followed by isotropic etching, in order to achieve U-shaped, rounded, or sigma shaped cavities.

Figure 2C:
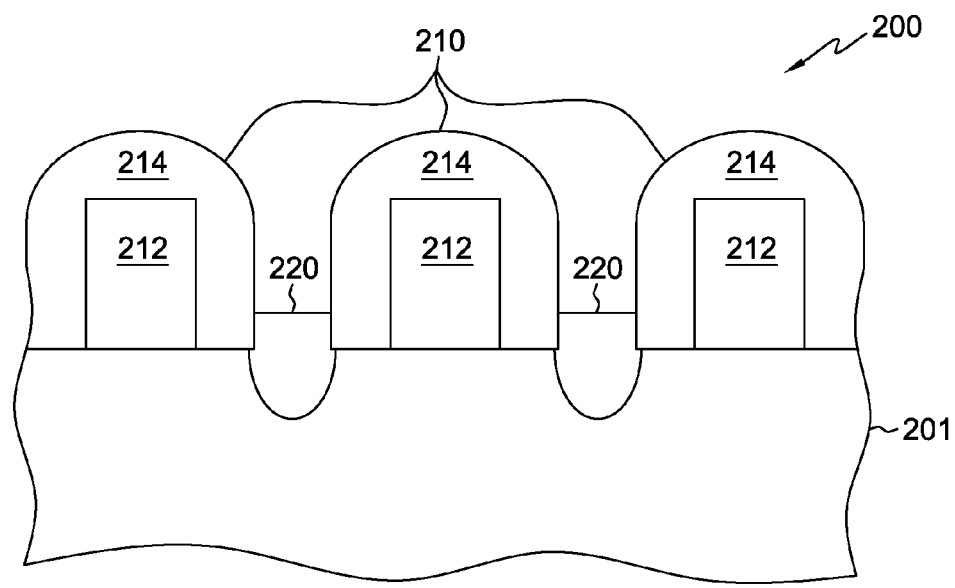
FIG. 2C depicts the structure of FIG. 2B after forming, within the cavity of the substrate structure, source region(s) or drain region(s) of a transistor, in accordance with one or more aspects of the present invention.

FIG. 2C depicts structure 200 after forming, within cavity 202 of substrate structure 201, source regions or drain regions 220 of a transistor, in accordance with one or more aspects of the present invention.

In one embodiment, forming source regions or drain regions 220 includes growing, epitaxially, source regions or drain regions 220 within cavities 202 (see FIG. 2B) of substrate structure 201. Epitaxial formation or growth refers to the orderly growth of a crystalline material from a substrate, where the grown material arranges itself in the same crystal orientation as the underlying substrate. In one example, epitaxial growth occurs from either one or more surfaces of cavity 202, including, for example, a $\{111\}$ plane, a $\{110\}$ plane, and a $\{100\}$ plane. Material may be epitaxially formed or grown using selective epitaxial growth via various methods, such as, for example, vapor-phase epitaxy (VPE), a modification of chemical vapor deposition (CVD), molecular-beam epitaxy (MBE), and/or liquid-phase epitaxy (LPE), or other applicable methods. The symbol $\{xyz\}$ denotes the Miller index for the set of equivalent crystal planes. For example, substrate structure 201 can be oriented so that the upper surface is a $\{100\}$ plane.

For example, source regions or drain regions 220 can include stressed portions 224, formed during epitaxial growth. For example, an epitaxial growth of silicon and doped with germanium (i.e. larger atoms than silicon) can result in compressive stress in the stressed portion 224. Similarly, an epitaxial growth of Si with carbon (smaller atoms than silicon) can result in tensile stress in the stressed portion 224 of the source regions or drain regions 220. The surface of source regions or drain regions 220 may have some defects, dislocations or stacking faults related to the stress after epitaxial growth.

Figure 2D:
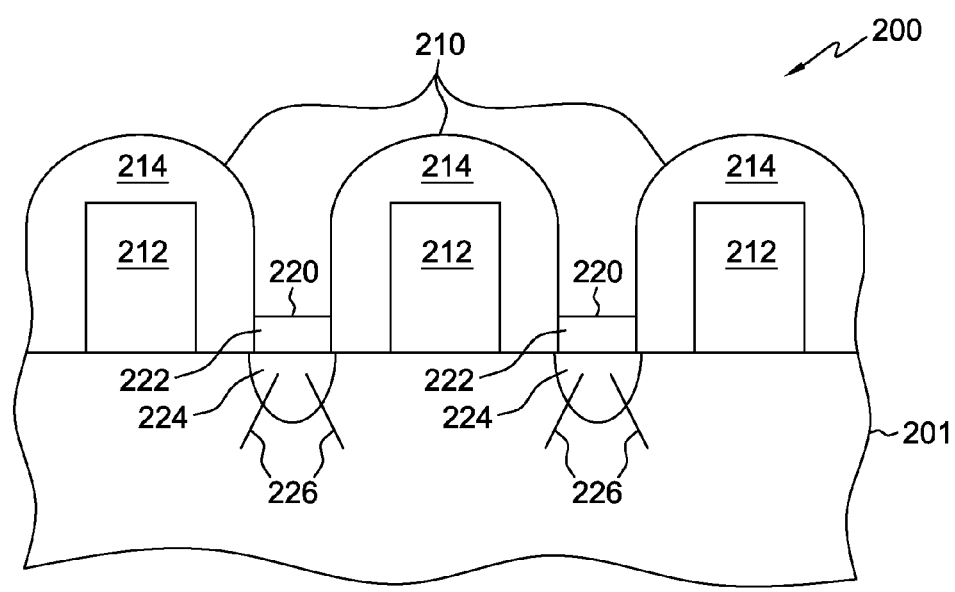
FIG. 2D depicts the structure of FIG. 2C after forming stressed portion(s) of the source region(s) or drain region(s), in accordance with one or more aspects of the present invention.

FIG. 2D depicts structure 200 after forming stressed portion(s) 224 of the source region(s) or drain region(s) 220, in accordance with one or more aspects of the present invention. For example, stressed portion 224 can have a tensile stress (for re-channel transistor) or a compressive stress (for p-channel transistor).

In one embodiment, stressed portion 224 can be formed using a stress memorization technique (SMT). In another embodiment, silicon or germanium may be implanted into source region or drain region 220, resulting in an amorphous surface thereof. In another embodiment, a material layer, such as a conformal material layer (e.g., a nitride layer with tensile stress) can be provided over source region or drain region 220. In another embodiment, the conformal-stressed material layer and the source region or drain region 220 can be annealed (or baked-in) in order to form stressed portion 224 (i.e. the stress from the conformal layer is memorized therein). If the tensile stress in conformal layer is strong enough, stacking faults 226 (for example, located deeper in the junction) may be formed within source region or drain region 220, including lower portion 224. This indicates that the tensile stress in source region or drain region 220 is large enough to reach the critical value for the formation of stacking faults. The SMT is typically used for source region or drain region 220 in n-channel FET.

Figure 2E:
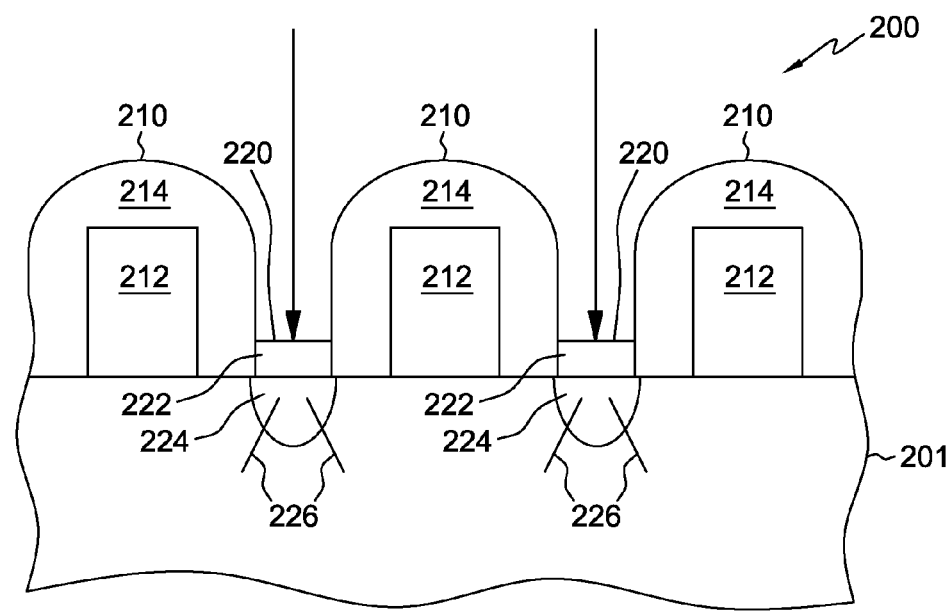
FIG. 2E depicts the structure of FIG. 2D after melting upper portion(s) of the source region(s) or drain region(s) thereof, in accordance with one or more aspects of the present invention.

FIG. 2E depicts structure 200 after melting upper portion(s) 222 of source region(s) or drain region(s) 220, in accordance with one or more aspects of the present invention. For instance, melting upper portion 222 of source region or drain region 220 can be accomplished without melting stressed portion 224, and the amount of stress in stressed portion 224 can be maintained during the melting process. In such a case, stressed portion 224 in source region or drain region 220 can induce stress (e.g., compressive stress or tensile stress) within a channel region underlying gate structure 210, notwithstanding the melting process.

In one embodiment, melting includes spike annealing, such as laser spike annealing, upper portion 222 of the at least one source region or drain region to reduce the surface defects and/or sub-surface defects thereof. For example, an ultra-short laser pulse time of between one nanosecond and several microseconds can be applied to upper portion 222 to melt a layer, such as a monolayer, or a layer of several atoms, without melting stressed portion 224, located below upper portion 222. In one specific example, surface melting can be achieved using an ultra-short pulse laser with nanosecond scale pulse and a fluence (a measure of energy density) of approximately 1-2 Joule/cm². In another specific example, precisely controlled surface melting can be achieved using ultra-short pulse melt annealing with pulse time of between 20-200 nanoseconds and a fluence of approximately 1.35-1.55 J/cm².

In such a case, thermal energy exerted on upper portion 222 does not reach stressed portion 224, and thus will not lead to relaxation of the stress therein. In a spike annealing process, a small region can be ramped up to a high temperature in a relatively short period of time without heating adjacent regions. For example, a laser spike annealing system can be employed, with structure 200, such as a wafer, under laser beam scanning to allow exposure of enough energy on the upper portions 222. In another example, melting is performed using a process with high power density and short pulsing capability.

Advantageously, a melting process can repair defects formed during epitaxial formation or growth, and the use of laser annealing with an ultra-short dwell time and high power can melt only the upper portions 222 of source regions or drain regions 220. Subsequent to melting, rapid crystallization can be achieved as described below with respect to FIG. 2F.

Figure 2F:
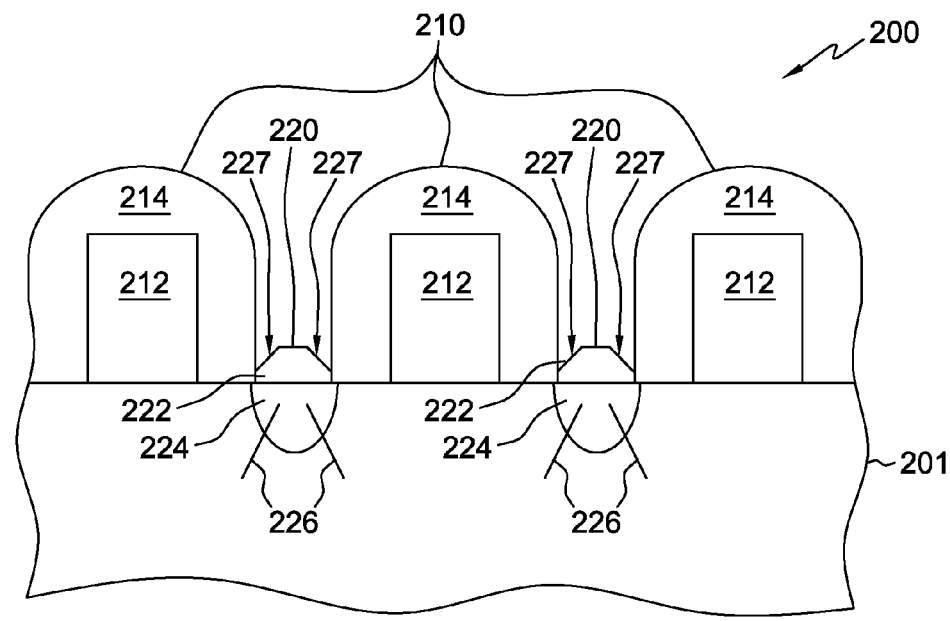
FIG. 2F depicts the structure of FIG. 2E after resurfacing the source region(s) or drain region(s) thereof, in accordance with one or more aspects of the present invention.

FIG. 2F depicts structure 200 after resurfacing source region(s) or drain region(s) 220 thereof, in accordance with one or more aspects of the present invention. In one embodiment, resurfacing upper portions 222 of source regions or drain regions 220 includes a melting and re-crystallization process.

For instance, after a melting process as described with respect to FIG. 2E, upper portions 222 can flow and/or re-crystallize, thereby eliminating surface defects and restore periodic structure of the crystal lattice by eliminating and/or repairing defects. In addition, the resurfacing can favorably form denser surfaces, such as {111} sloped surface(s) 227.

Advantageously, resurfaced source regions or drain regions 220 can prevent piping of metals, such as nickel, through defects or imperfections in upper surfaces 222 to lower regions such as stressed portions 224, which can lead to metal spikes forming within regions of structure 200. In addition, resurfacing can eliminate small stacking faults within upper portion 224, eliminating weak points that can lead to damage and prevent undesirable and uncontrolled etching of structure 200 during a replacement gate process.

In one embodiment, the resurfacing can reduce stray capacitance between the source region or drain region 220 and gate structure 210 of an after-formed transistor. For example, stray capacitance can be reduced because {111} faceted surfaces 227 does not have sharper corners and are also farther away from gate structure 210. Advantageously, the present techniques allow for precise control of {111} faceting formation, which can be difficult to consistently achieve during epitaxial growth alone.

In another embodiment, the resurfacing can shift upper portion 224 of source region or drain region 220 away from a channel region of the transistor to facilitate forming a conductive contact on the at least one source region or drain region. For example, moving material of upper portion 224 away from gate structure 210, can facilitate formation of a conductive contact above upper portion 224 because it can be easier for the material of a conductive contact to contact upper portion 224 instead of being blocked by gate structure 210.

In a further embodiment, the resurfacing can reduce an electrical resistance of source region or drain region 220, e.g., by reducing surface defects.

By way of summary, in one implementation, the present technique allows the formation of source regions or drain regions 220 with stacking faults in deeper junctions therein to provide embedded stresses or strains (see FIG. 2B-2D), followed by reduction of surface and/or sub-surface defect(s) of upper portion 222 and concurrently maintaining defect(s) in a lower stressed portion 224 (see FIGS. 2E-2F), resulting in the formation of resurfaced source regions or drain regions 220.

Figure 3A:
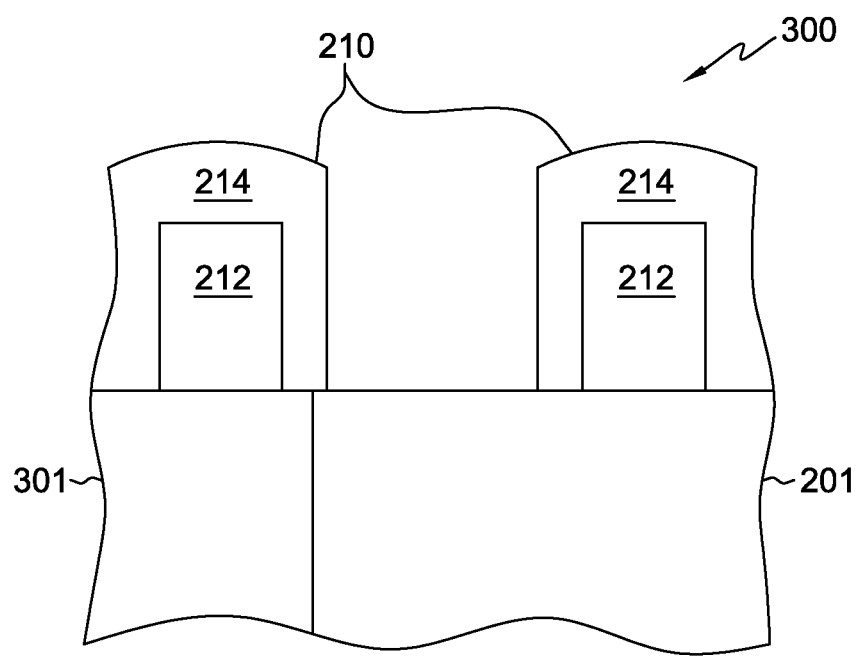
FIG. 3A is a cross-sectional elevational view of a structure found in transistor fabrication, in accordance with one or more aspects of the present invention.

FIG. 3A depicts a structure 300 found in transistor fabrication, in accordance with one or more aspects of the present invention. By contrast with the embodiment of FIG. 2A, structure 300 includes an isolation region 301, such as a shallow trench isolation region. Isolation region 301 can be formed at the edge of substrate structure 201.

Figure 3B:
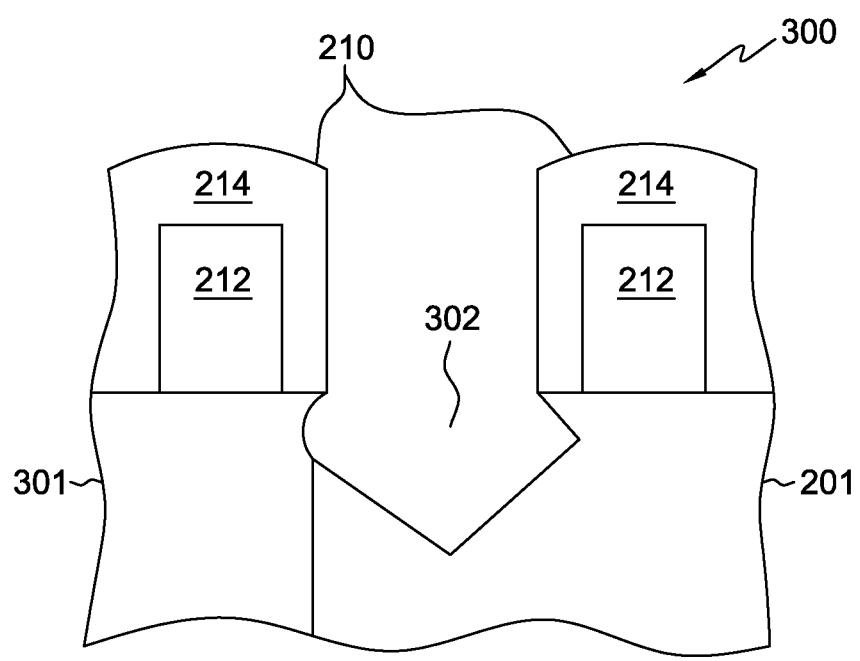
FIG. 3B depicts the structure of FIG. 3A after providing a cavity of a substrate structure thereof, in accordance with one or more aspects of the present invention.

FIG. 3B depicts structure 300 after providing a cavity 302 of substrate structure 201, in accordance with one or more aspects of the present invention. By contrast with the embodiment of FIG. 2B, FIG. 3B depicts the formation of (sigma) cavity 302, so that cavity 302 is bounded on one side (e.g., the right side as illustrated in FIG. 3B) by substrate 201, which is a semiconductor material, and bounded on the other side (e.g., the left side as illustrated in FIG. 3B) by isolation region 301, such as a shallow trench isolation region, which can be an insulator material, such as an oxide.

In addition, as explained with respect to FIG. 2B, cavity 302 includes angular planes {111}, and can be referred to as a sigma cavity. Cavity 302 can be used to support applications such as p-type field effect transistors, and may be formed using an appropriate combination of isotropic and/or anisotropic etching to encourage formation of the sigma shaped facets.

Figure 3C:
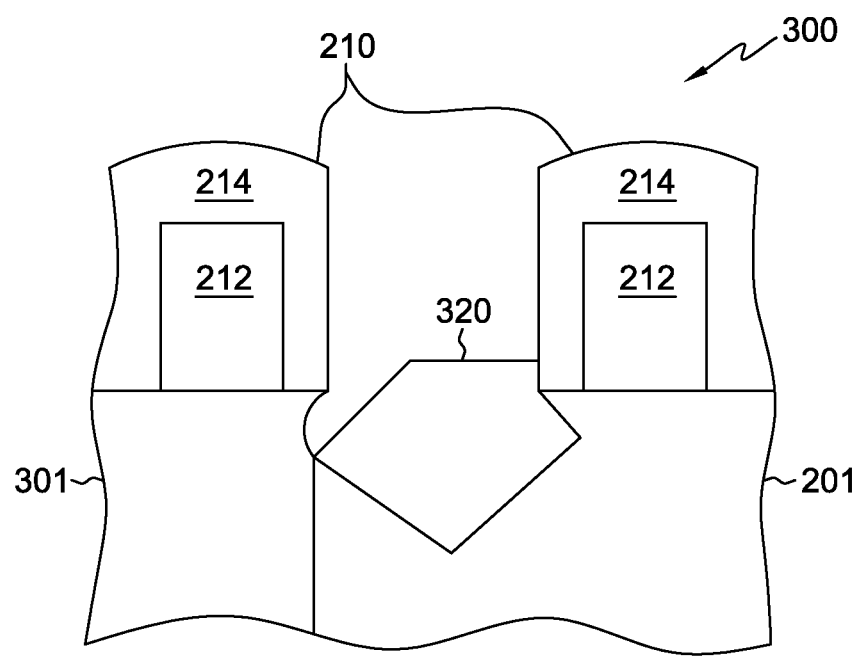
FIG. 3C depicts the structure of FIG. 3B after forming, within the cavity of the substrate structure, source region(s) or drain region(s) of a transistor, in accordance with one or more aspects of the present invention.

FIG. 3C depicts structure 300 after forming, within cavity 302 of substrate structure 301, source region(s) or drain region(s) 320 of a transistor, in accordance with one or more aspects of the present invention. By contrast with the embodiment of FIG. 2C, in the embodiment of FIG. 3C, because epitaxial growth of the material of source region or drain region 320 prefers to grow from semiconductor surfaces, such as substrate structure 201, and does not prefer to grow from insulators such as isolation material 301, source region or drain region 320 grows asymmetrically with a greater amount of material located on the side bounded by substrate 201 (e.g., the right side) as opposed to the side bounded by isolation material 301 (e.g., the left side).

Figure 3D:
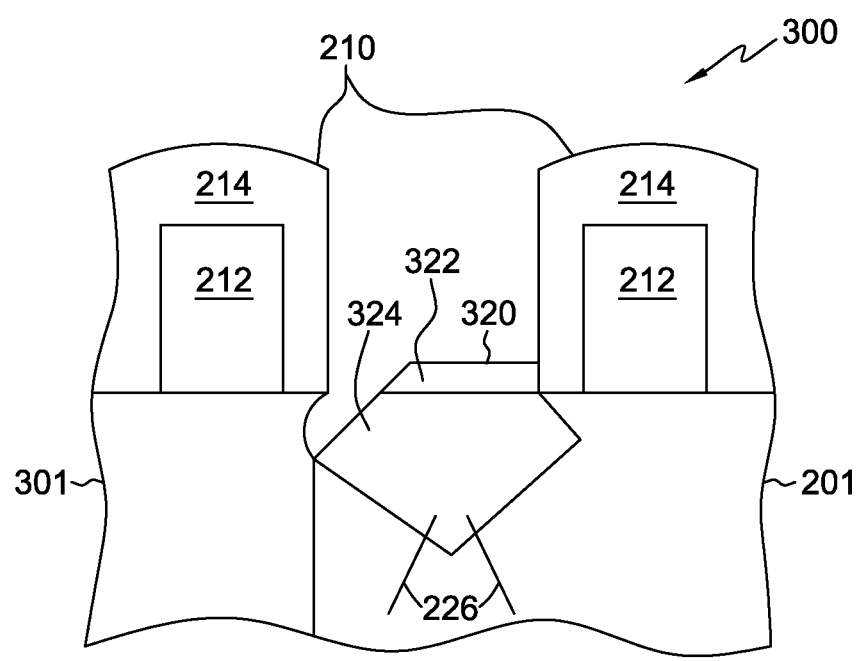
FIG. 3D depicts the structure of FIG. 3C after forming stressed portion(s) of the source region(s) or drain region(s), in accordance with one or more aspects of the present invention.

FIG. 3D depicts structure 300 after forming stressed portion(s) 324 of source region(s) or drain region(s) 320, in accordance with one or more aspects of the present invention. The stressed portion 324 may be formed by stress memorization technique SMT or by Si epitaxial growth (with Ge or C doping for compressive or tensile stress respectively). In another embodiment, a combination of both stress memorization technique (SMT) and followed by cavity formation and epi-growth are used. In the illustrated embodiment, upper portions 322 of source regions or drain regions 320 are disposed above stressed portions 324 and stacking faults 226.

Figure 3E:
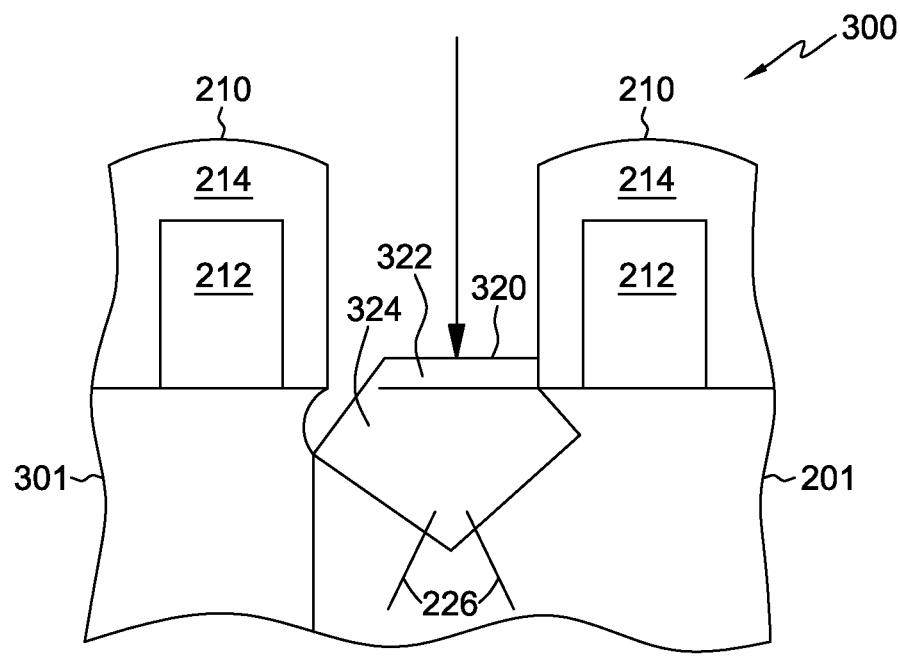
FIG. 3E depicts the structure of FIG. 3D after melting upper portion(s) of the source region(s) or drain region(s) thereof, in accordance with one or more aspects of the present invention.
Figure 3F:
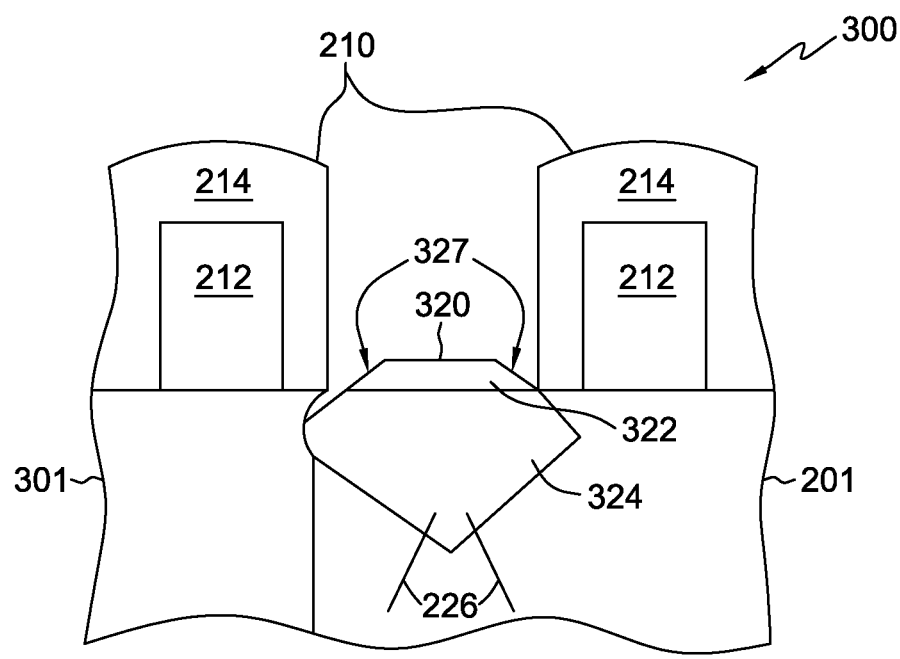
FIG. 3F depicts the structure of FIG. 3E after resurfacing the source region(s) or drain region(s) thereof, in accordance with one or more aspects of the present invention.

FIGS. 3E-3F depict structure 300 after melting upper portion(s) 322 and resurfacing source region(s) or drain region(s) 320, in accordance with one or more aspects of the present invention. In the embodiment of FIG. 3F, resurfacing source regions or drain regions 320 leads to formation of faceted surfaces 327, and the redistribution of material of both upper portion 322 and stressed portion 324 to become more symmetrical. For example, increased symmetry can lead to increased contact surface area.

In another embodiment, gate structure 210 above isolation region 301 may not be provided. In such a case, epitaxial formation of source region or drain region 320 can be further asymmetric, with material tending towards the side bounded by substrate structure 201, because without a gate structure on the side of cavity 302 bound by isolation material 301, epitaxial growth may be less confined. For example, the resurfacing techniques described herein can be used to redistribute material to achieve greater symmetry of source regions or drain regions 320.

By way of summary, for instance, FIGS. 2A-2F illustrate {111} facet formation and elimination of surface defects by source/drain resurfacing techniques of the present disclosure. In addition, FIGS. 3A-3F illustrate how an asymmetrical source/drain region can be improved, including {111} facet formation and elimination of surface defects, by resurfacing techniques of the present disclosure. Further, laser surface treatment of n-type source/drain regions and p-type source/drain regions can proceed at separate steps, for example, after p-type epitaxial growth (e.g., with the n-junction regions covered by oxide) and after n-type SMT and/or epitaxial-growth (e.g., with p-junction regions covered by oxide), with similar or different laser process parameters (e.g., optimized separately for n-type or p-type regions).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A method comprising:
fabricating a transistor over a substrate structure, the transistor comprising at least one of a source region or a drain region, wherein the at least one source region or drain region comprises a stressed portion, and the fabricating comprises:
forming, within a cavity of the substrate structure, the at least one source region or drain region including the stressed portion thereof, wherein the forming comprises growing, epitaxially, the at least one source region or drain region within the cavity of the substrate structure; and resurfacing the at least one source region or drain region to reduce surface defects of the at least one source region or drain region without relaxing the stressed portion thereof;
wherein resurfacing comprises providing the at least on source region or drain region with at least one {111} surface.

2. The method of claim 1, wherein the resurfacing comprises melting an upper portion of the at least one source region or drain region without melting the stressed portion thereof.

3. The method of claim 1, wherein the resurfacing comprises re-crystallizing an upper portion of the at least one source region or drain region.

4. The method of claim 1, wherein the resurfacing comprises laser annealing the upper portion of the at least one source region or drain region to reduce the surface defects thereof.

5. The method of claim 1, wherein the transistor comprises a channel region of the substrate structure adjacent to the at least one source region or drain region and a gate structure disposed above the channel region, and the resurfacing comprises decreasing a capacitance between the at least one source region or drain region and the gate structure of the transistor.

6. The method of claim 1, wherein the transistor comprises a channel region of the substrate structure adjacent to the at least one source region or drain region, and the resurfacing comprises shifting the upper portion of the at least one source region or drain region away from the channel region of the transistor to facilitate forming a conductive contact on the at least one source region or drain region.

7. The method of claim 1, wherein resurfacing the at least one source region or drain region inhibits diffusion into the at least one source region or drain region.

8. The method of claim 1, wherein the resurfacing comprises reducing an electrical resistance of the at least one source region or drain region.

9. The method of claim 1, wherein the fabricating further comprises:
maintaining, during the resurfacing, a crystal structure of the stressed portion of the at least one source region or drain region.

10. The method of claim 1, wherein the forming comprises:
providing a conformal layer over the at least one source region or drain region; and
annealing the conformal layer and the at least one source region or drain region to form the stressed portion of the at least one source region or drain region.

11. The method of claim 1, wherein the forming comprises using a stress memorization process to provide the stressed portion of the at least one source region or drain region.

12. The method of claim 1, wherein the forming comprises providing one or more defects within the at least one source region or drain region, including within both an upper portion and a lower portion thereof, and the resurfacing comprises:
reducing the one or more defects of the upper portion of the at least one source region or drain region; and
maintaining the one or more defects of the lower portion of the at least one source region or drain region, wherein the one or more defects of the lower portion comprise the stressed portion of the at least one source region or drain region.

13. The method of claim 1, further comprising providing a metallic material over the at least one source region or drain region, wherein resurfacing the at least one source region or drain region inhibits diffusion of the metallic material into the at least one source region or drain region.

14. The method of claim 1, wherein the resurfacing comprises:
melting an upper portion of the at least one source region or drain region; and
re-crystallizing the upper portion of the at least one source region or drain region.

15. The method of claim 14, wherein the melting comprises laser annealing the upper portion of the at least one source region or drain region to reduce the surface defects thereof.

16. The method of claim 15, wherein the laser annealing melts the upper portion of the at least one source region or drain region without melting a lower portion of the at least one source region or drain region.

17. The method of claim 14, wherein the re-crystallizing comprises providing the at least one source region or drain region with at least one {111} surface.

18. The method of claim 14, wherein the transistor comprises a channel region of the substrate structure adjacent to the at least one source region or drain region, and the melting and re-crystallizing comprise redistributing the upper portion of the at least one source region or drain region away from the channel region of the transistor to facilitate forming a conductive contact on the at least one source region or drain region.

19. A method comprising:
fabricating a transistor over a substrate structure, the transistor comprising at least one of a source region or a drain region, wherein the at least one source region or drain region comprises a stressed portion, and the fabricating comprises:
forming, within a cavity of the substrate structure, the at least one source region or drain region including the stressed portion thereof; and
resurfacing the at least one source region or drain region to reduce surface defects of the at least one source region or drain region without relaxing the stressed portion thereof, wherein the resurfacing comprises providing at the at least one source or drain region with at least one {111} surface.

* * * * *